United States Patent [19]
Hall

[11] Patent Number: 5,249,348
[45] Date of Patent: Oct. 5, 1993

[54] PRESSURE FOOT INSERT CHANGER

[75] Inventor: Hendley W. Hall, San Pedro, Calif.

[73] Assignee: Excellon Automation, Torrance, Calif.

[21] Appl. No.: 702,089

[22] Filed: May 17, 1991

[51] Int. Cl.$^5$ .............................................. B23Q 3/155
[52] U.S. Cl. ...................................................... 483/18
[58] Field of Search ........................... 29/568; 211/1.5; 409/184, 197; 408/95, 51, 98

[56] References Cited

U.S. PATENT DOCUMENTS

| | | | |
|---|---|---|---|
| 3,973,863 | 8/1976 | Smith | 29/568 X |
| 4,520,551 | 6/1985 | Imhof | 29/568 |
| 4,658,494 | 4/1987 | Ohtani et al. | 29/568 |
| 4,761,876 | 8/1988 | Kosmonski | 29/568 |
| 4,865,494 | 9/1989 | Gudon | 364/474.17 X |

FOREIGN PATENT DOCUMENTS 86156 5/1986 Japan ..................... 29/568

*Primary Examiner*—William Briggs
*Attorney, Agent, or Firm*—Knobbe, Martens, Olson & Bear

[57] ABSTRACT

In a drilling machine having a movable worktable and a spindle assembly having a pressure foot, a spindle, and a removable pressure foot insert in the pressure foot, an insert changer is provided for automatically removing and reinserting the insert from the pressure foot to permit a drill tool change to be effected in the spindle. The insert changer has a gripper for gripping the insert and disengaging the insert from the pressure foot. A vacuum is preferably provided on the gripper for creating a vacuum seal region between the gripper and insert to create a gripping force on the insert. A lifter is provided on the insert changer to move the gripper into and out of contact with the insert. The insert is preferably retained within the pressure foot by oppositely poled magnets respectively on the pressure foot and on the insert to create a magnetic bonding force therebetween, wherein the gripping force created by the vacuum is sufficiently strong to overcome the magnetic bond so as to disengage the insert from the pressure foot. Further, an insert magazine is mounted on the drilling machine having bays for storing a plurality of inserts having different drill hole diameters. A method for automatically changing an insert in the pressure foot with an insert having a different size includes automatically removing the insert from the pressure foot via the insert changer, placing the insert into the magazine, taking a new insert from the magazine, and placing the new insert into the pressure foot.

14 Claims, 13 Drawing Sheets

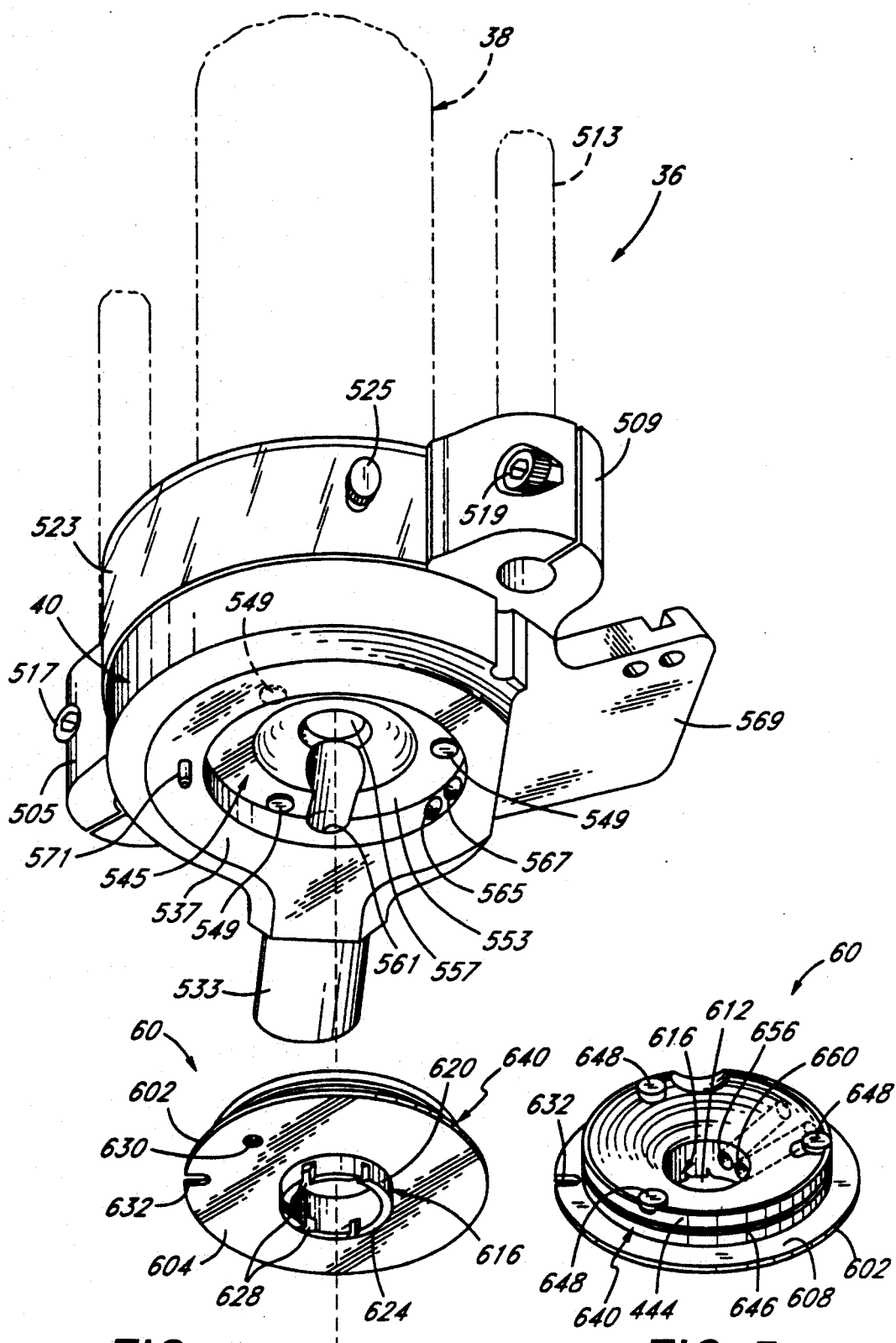

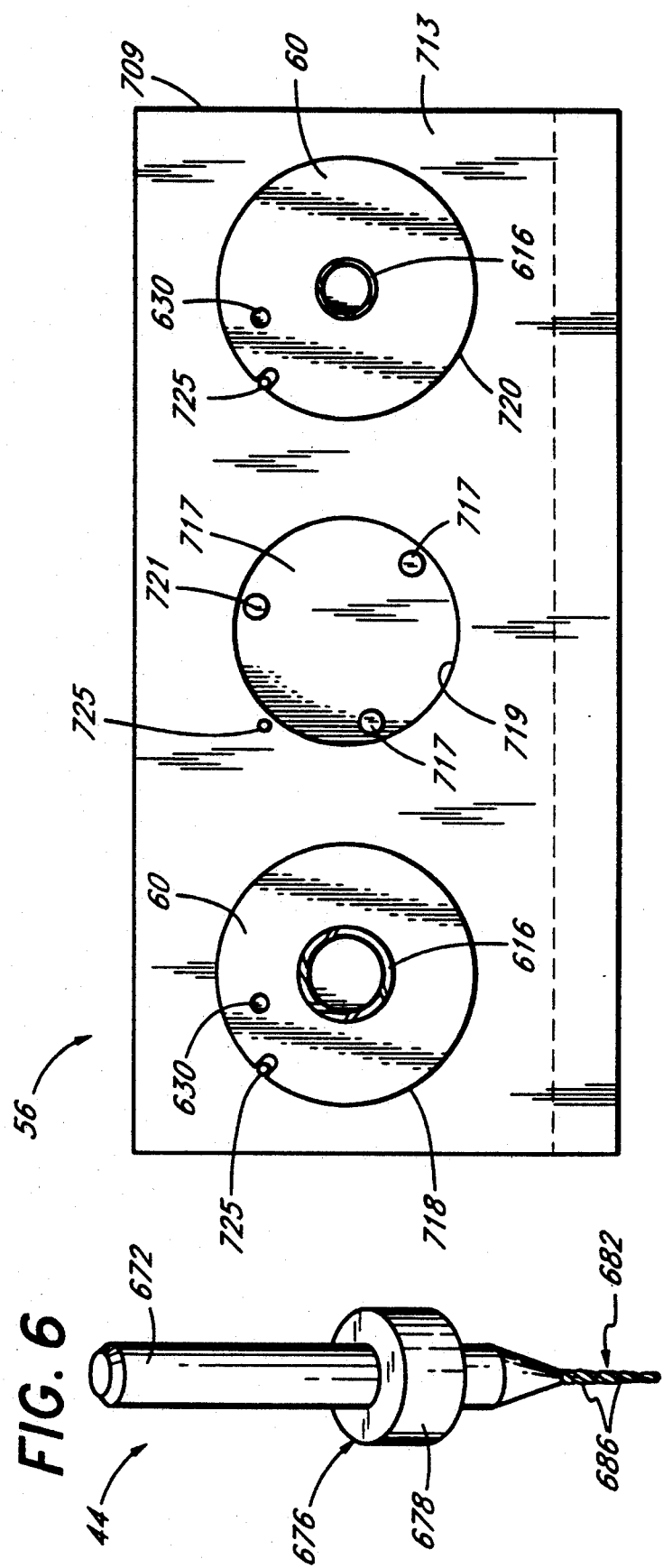

PRESSURE FOOT INSERT CHANGER

FIELD OF THE INVENTION

The present invention relates generally to the field of printed circuit board drilling machines, and in particular to a pressure foot insert changer for use on such a machine.

BACKGROUND OF THE INVENTION

In the manufacture of printed circuit boards for industrial use, often literally thousands of small pin holes must be drilled into each circuit board so that appropriate electronic components may be mounted into the pin holes and soldered onto the board. In volume production of the circuit boards, the drilling of holes is accomplished by computer-controlled automatic drilling machines in which the printed circuit boards are usually situated on a worktable movable in a horizontal X-Y plane. The worktable is moved horizontally in an incremental fashion beneath a drill spindle so that the pin holes may be drilled at proper locations in the circuit boards by movement of the drill spindle through a vertical drilling stroke. This is a very rapid and satisfactory procedure for mass production of printed circuit boards. However, many printed circuit boards require the drilling of holes having several different diameters. Consequently, drill tools having tips of varying diameters must be employed during the drilling of each such board. In addition, drill tools rapidly wear out and therefore need frequent replacing. In both cases, the drilling of holes must stop until one drill tool is removed from the drill spindle and a new drill tool of the same or different size is mounted in the drill spindle.

In order to facilitate the replacement of drill tools, apparatuses have been developed for automatically changing the drill tool. Such a device is shown, for example, in U.S. Pat. No. 3,973,863 to Smith. That patent discloses a drill tool transfer device having a movable transfer collet comprising a slotted sleeve which is automatically positioned below a drill spindle holding a drill tool which is to be replaced. The transfer collet is provided with a means for gripping a plastic collar on the shank of the drill tool. The collet grips the collar and then returns the drill tool to a drill tool magazine mounted on the drilling machine. A new drill tool is then taken by the sleeve of the tool transfer device and mounted in the drill spindle, thereby allowing drilling to continue. The advent of automatic drill replacement has resulted in a substantial reduction in the time it takes to replace a spindle drill tool, and thus has significantly decreased drilling time.

An additional advantageous development in circuit board drilling technology is the use of a pressure foot normally formed on the bottom of the drill spindle assembly. In use, the pressure foot tightly holds down a stack of circuit boards in a fixed position during drilling of the boards. The pressure foot prevents movement of the boards and prevents the formation of burrs in the boards which arise around the drill site during drilling, and also improves the accuracy of the holes drilled in the circuit boards. The pressure foot desirably includes a ring-shaped contact element which tightly presses down on the circuit boards during the drill stroke. The drill tool passes through a center opening in the contact element during the drill stroke.

It has been found that the efficacy of the pressure foot in reducing burrs and in improving hole accuracy is greatly increased where the contact element of the pressure foot is disposed in close proximity around the drill tool. In most cases, however, the preferable diameter of the center opening in the contact element is too small to permit the drill tool transfer device to pass through it and into the pressure foot to effect a drill tool change. As a result, in order to accommodate the need for automatically replacing drill tools while at the same time maintaining small contact elements, removable pressure foot inserts are used which mount into the bottom of the pressure foot. The pressure foot insert is removed prior to a drill tool change to allow the transfer collet on the drill tool transfer device to access the drill tool on the spindle. The insert is then remounted in the drill spindle after the tool change has taken place.

Additionally, because it is advantageous that the diameter of the center opening of the contact element be only slightly larger than the diameter of the drill tool so that the contact element applies pressure near to the drill site, it is desirable to provide a number of pressure foot inserts having center openings of various sizes to accommodate different drill tool sizes. The size of the insert opening depends upon the size of the drill tool used. For example, if a large diameter drill tool is used, a pressure foot insert having a correspondingly large diameter center opening is mounted in the bottom of the pressure foot to allow the drill tool to pass through the center opening. Similarly, if a small drill tool is used, an insert having a correspondingly small diameter center opening is used in the pressure foot.

The pressure foot insert must be removed and replaced any time that a drill tool change occurs, whether because a drill tool having a different diameter is needed or because the currently used drill tool is worn out and requires replacing. Manual removal and reinsertion of the pressure foot insert requires stopping the drill machine and is therefore unacceptably slow. Therefore, there is a need for a device and method for automatically and rapidly removing a pressure foot insert from a pressure foot during the drilling of printed circuit boards and for replacing the insert after a drill tool change. Further, there is a need for a device which can change the pressure foot insert in response to a change in the diameter of the drill tool.

SUMMARY OF THE INVENTION

The present invention relates to a device for automatically removing and replacing a pressure foot insert in a pressure foot of a drilling machine spindle assembly to permit a drill tool change to be effected in a spindle. The device or insert changer is preferably mounted on a movable worktable below the spindle assembly. The insert changer includes a gripper which is brought into contact with the releasably held insert on the pressure foot and which has means for gripping the insert to create a gripping force of sufficient strength to disengage the insert from the pressure foot. In the preferred embodiment, the gripper comprises a vacuum means for creating a vacuum seal region between said gripper and said insert which creates a gripping force on said insert. The vacuum seal region is preferably defined between two circular sealing rings fixed onto an engaging portion of the gripper wherein the rings contact and seal against the insert so that the insert closes the vacuum seal region.

In the preferred embodiment, the pressure foot insert is retained on the pressure foot by oppositely poled magnets formed respectively on the pressure foot and on the insert. A circular counter-bore in which the insert is retained is recessed into the bottom of the pressure foot. The counter-bore has three magnets embedded therein having a first polarity, while the insert has three magnets embedded therein having a second polarity, wherein the insert magnets are disposed thereon to juxtapose against the counter-bore magnets when the insert is retained therein, thereby creating a magnetic bonding force to retain the insert in the pressure foot.

As an additional aspect of the present invention, an insert magazine is mounted on the drilling machine and is used for releasably holding a plurality of inserts thereon. Preferably, a holding plate has a bottom surface having recessed therein a plurality of bays configured to receive pressure foot inserts therein. The holding plate bays are similar to the counter-bore in the pressure foot in that they have magnets embedded therein having the first polarity so that a magnetic bonding force acts to hold the inserts within the bays when the inserts are placed therein.

Further, a method is disclosed for automatically changing a pressure foot insert including the steps of automatically removing a pressure foot insert from the pressure foot, replacing a drill tool in the spindle with a drill tool having a different diameter, and automatically placing a second insert in the pressure foot wherein the second insert has a drill tool hole has a different diameter than that of the first insert so that a contact element on the insert for pressing against a stack of circuit boards during a drilling operation is disposed closer to the drill tool to reduce burrs and improve hole accuracy.

BRIEF DESCRIPTION OF THE DRAWINGS

FIG. 4 is a bottom perspective view of a pressure foot and a detached pressure foot insert.

FIG. 5 is a top perspective view of the pressure foot insert shown in FIG. 4.

FIG. 6 is a perspective view of a drill tool used for drilling printed circuit boards.

FIG. 7 is a bottom plan view showing the bottom of a pressure foot insert magazine.

DESCRIPTION OF THE PREFERRED EMBODIMENT

Figure 1:
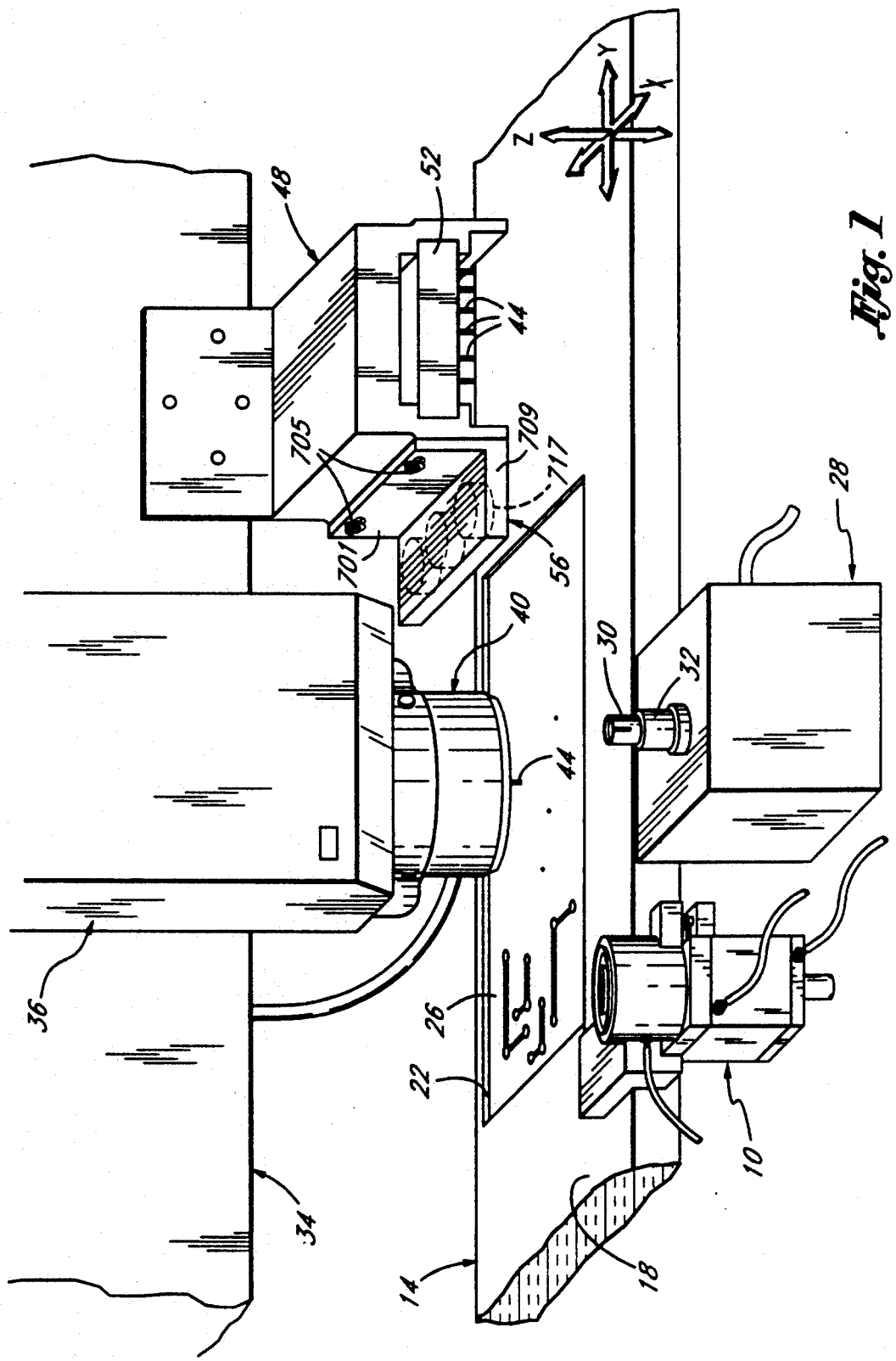
FIG. 1 is a perspective view of a portion of an automatic circuit board drilling machine which uses the pressure foot insert changer of the present invention.

In FIG. 1, which illustrates a portion of a drilling machine, an insert changer 10 is shown mounted onto the side of a worktable 14. An upper surface 18 of the worktable 14 has a rectangular recessed portion 22 in which is positioned a stack of circuit boards 26. The worktable 14 is movable in a horizontal plane in either the X or Y directions shown by arrows. A drill tool transfer assembly 28, such as that shown in U.S. Pat. No. 3,973,863 to Smith, is mounted onto the side of the worktable 14 near the insert changer 10. The transfer assembly 28 has a transfer collet 30 movable in a vertical Z-axis via a transfer piston 32.

Still referring to FIG. 1, a bridge assembly 34 supports at least one spindle assembly 36 mounted thereon wherein the spindle assembly 36 includes a spindle 38 (shown in FIG. 4), a pressure foot 40, and a drill tool 44. Further mounted on the bridge assembly 34 is a tool magazine 48 having a drawer 52 for holding a plurality of drill tools 44 therein. Mounted on the tool magazine 48 is a pressure foot insert magazine 56 for holding and storing a plurality of pressure foot inserts 60.

I. Pressure Foot Insert Changer

Figure 2:
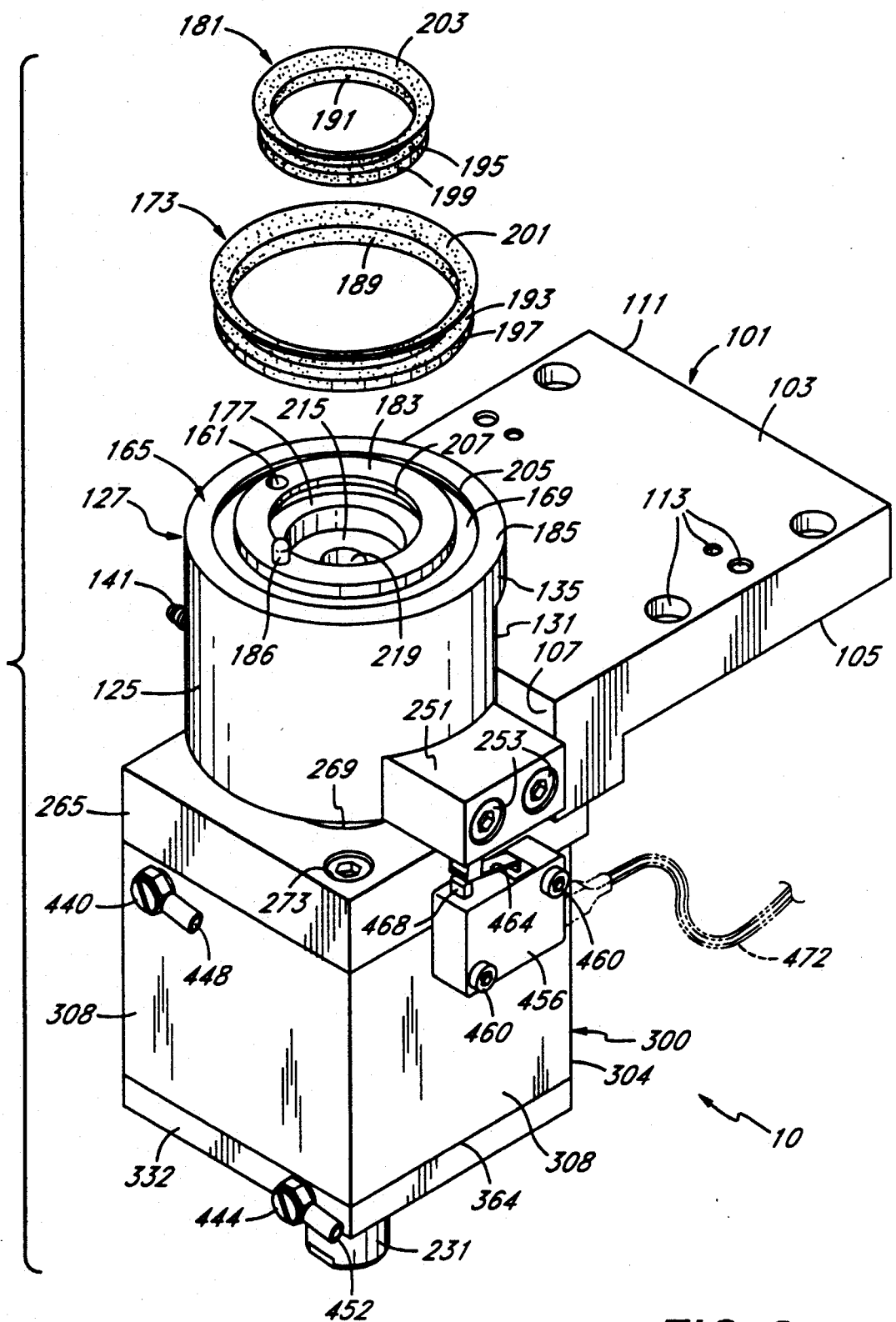
FIG. 2 is a perspective view of the pressure foot insert changer of the present invention showing exploded sealing rings.

Referring to FIG. 2, the insert changer 10 has a rectangular mounting piece 101 formed on one side thereof. The mounting piece 101 has an upper surface 103, a lower surface 105, a proximal end 107, a distal end 111, and a plurality of holes 113 for mounting the insert changer 10 on the upper surface 18 of the worktable 14 using screws.

The insert changer 10 comprises a gripper for gripping a pressure foot insert 60, and an elevation means for moving the gripper upward and downward in a vertical Z-axis. In the preferred embodiment illustrated in FIG. 2, the gripper is comprised of a body 125 preferably having a generally cylindrical shape which employs a vacuum means for grabbing onto the bottom of an insert. Further, the elevation means is preferably comprised of a pneumatic lifter 300.

Figure 3:
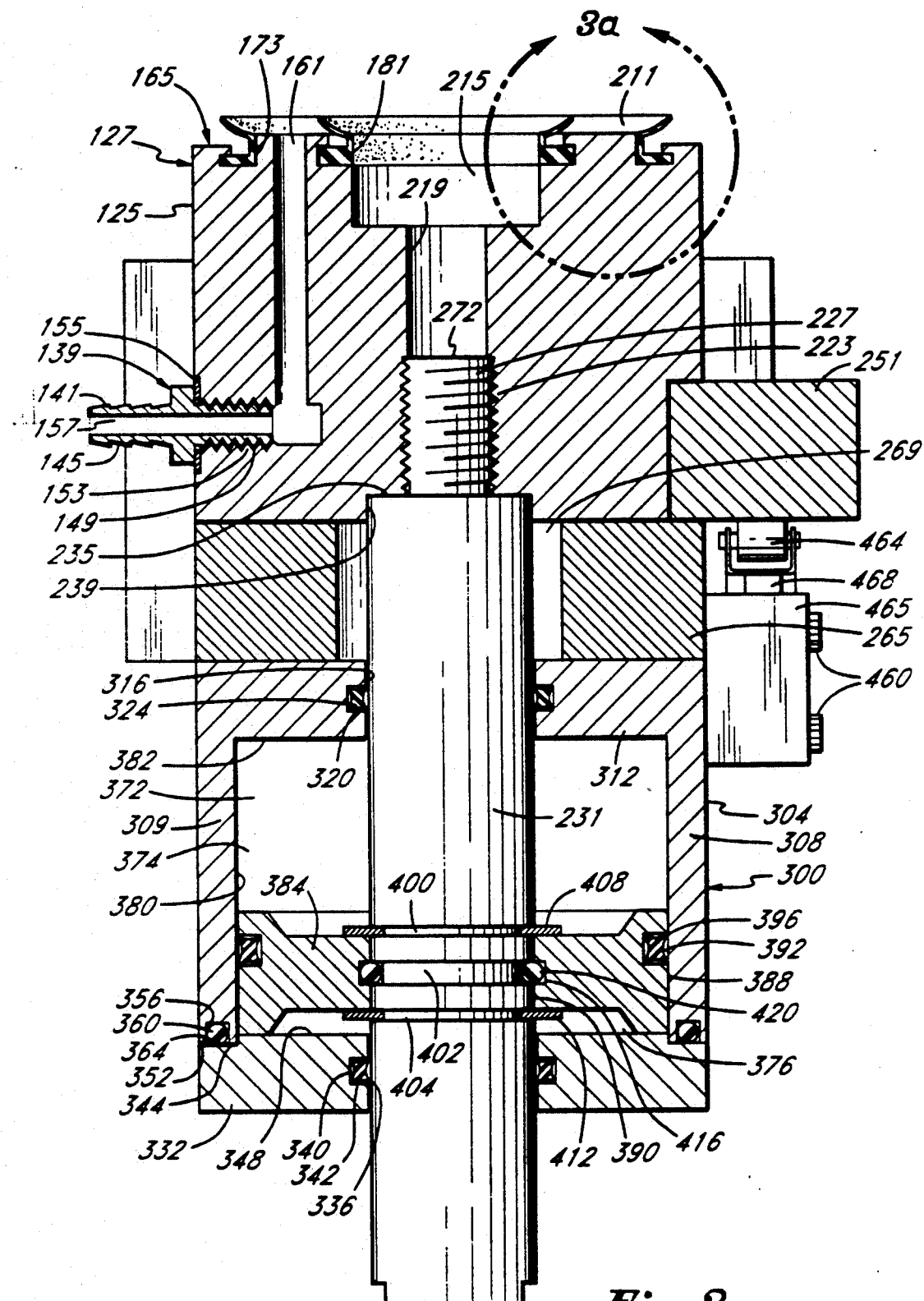
FIG. 3 is an assembled cross-sectional view of the pressure foot insert changer shown in FIG. 2 taken along line 2—2.

The body 125, shown in FIG. 2 in a partially up position, has an engaging portion 127 for gripping the pressure foot insert 60. Referring now also to FIG. 3, which is a cross-sectional view of the insert changer 10 in a down position, a vacuum hose fitting 139 is mounted into one side of the body 125. The vacuum hose fitting 139 includes a nozzle 141 which projects laterally outward from the body 125 and is provided with inwardly facing ribs 145. A threaded portion 149 screws into a cooperatively threaded wall 153 of a round hole in the side of the body 125, and a washer 155 is provided for mounting the hose fitting 139 therein. A lumen through the vacuum hose fitting 141 defines a vacuum port 157. The vacuum port 157 communicates with a round vacuum hole 161 in the body 125 that extends through to the upper surface 165 of the body 125.

Figure 3A:
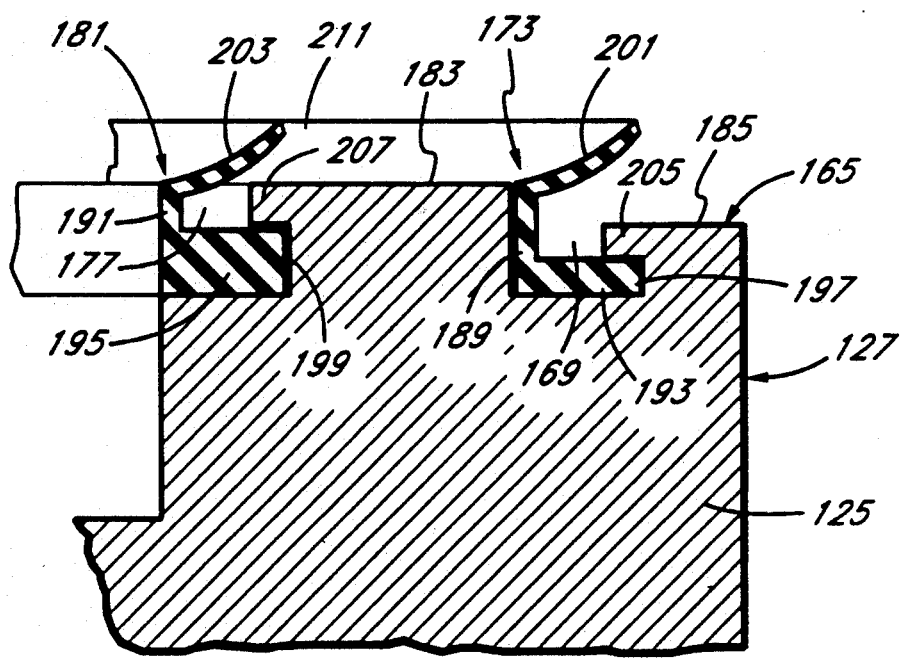
FIG. 3a is a partially enlarged view of a pressure foot insert vacuum gripping means.

The upper surface 165 of the body 125 is formed to receive a pressure foot insert 60 thereon and to further grip the insert 60 firmly thereon. As is best shown in FIG. 3a, an annular, outer recess 169 is formed in the upper surface 165 of the body 125 and is shaped to receive an outer sealing ring 173 therein. An annular, inner recess 177 in the upper surface 165 of the body 125, disposed inward from and coaxially to the outer recess 169, is shaped to receive an inner sealing ring 181 therein. The outer recess 169 and inner recess 177 define an annular, inner shelf 183 therebetween which is a portion of the upper surface 165. Further, the radially outermost portion of the upper surface 165, which is defined outward from the outer recess 169, forms an annular, outer shelf 185. The inner shelf 183 is preferably raised slightly relative to the outer shelf 185. As shown in FIG. 2, protruding upward from the inner shelf 183 is an integrally formed, rounded boss 186. The boss 186 preferably is disposed ninety degrees around the inner shelf 183 from the round vacuum hole 161 which opens onto the inner shelf 183.

As also seen in FIG. 3, in the illustrated embodiment the sealing rings 173 and 181 comprise V-ring seals which matingly fit into the respective recesses 169 and 177. The sealing rings 173 and 181 are preferably made from rubber. Referring now also to FIG. 3a, each sealing ring 173 and 181 comprises respective vertical portions 189 and 191, respective bottom lips 193 and 195 extending radially outward from the bottom of the vertical portion 189 and 191 and having respective outer rims 197 and 199, and respective curved flanges 201 and 203 extending radially outward and upward from the top of the vertical portions 189 and 191. The inner shelf 183 and outer shelf 185 have respective annular ledges 205 and 207 projecting inwardly therefrom. As can be seen best in FIG. 3a, when the sealing rings 173 and 181 are fit into the respective recesses 169 and 177, the respective outer rims 197 and 199 of the respective bottom lips 193 and 195 of the sealing rings 173 and 181 extend underneath the respective ledges 205 and 207. Further, the height of the respective bottom lips 193 and 195 are such that they snugly fit into the respective spaces defined below the respective ledges 205 and 207 in the respective recesses 169 and 177. The space directly between the respective curved flanges 201 and 203 define an annular vacuum seal region 211.

The body 125 has an elongate, round central bore 219 formed centrally therethrough and extending vertically from the top of the body 125 to the bottom of the body 125. The inner recess 177 of the upper surface 165 has a round counter-bore 215 recessed further thereinto in coaxial relation to the central bore 219. A lower section of the central bore 219 has a threaded wall 223 for receiving a correspondingly sized and matingly threaded post 227 which projects upward from and is integrally formed with an elongate cylindrical piston rod 231. An upper rim 235 of the piston rod 231 tightly fits into a shallow circular recess 239 formed in the bottom of the body 125 so that the top of the piston rod 231 abuts against the upper surface of the recess 239 when the post 227 of the piston rod 231 is fully screwed into the threaded wall 223 of the central bore 219.

Referring again to FIG. 2 and FIG. 3, a substantially rectangular depressor block 251 is mounted onto a side of the body 125 in opposite relation to the vacuum nozzle 141. The depressor block 251 is mounted onto the body 125 using screws 253. A sensor, for example a switch-magnet position sensor 456, is mounted by screws 460 onto one side of the pneumatic lifter 300 directly below the depressor block 251 on the body 125. An arm 464 projects upward at an angle from the sensor 456. The sensor 456 is mounted so that when the body 125 is in its lowest position, the depressor block 251 pushes down the arm 464 on the sensor 456 and the arm 464 in turn depresses a switch 468 on the sensor 456. The sensor 456 is connected to the drilling machine controller by a cable 472 and, when the switch 468 is depressed, the sensor 456 signals the controller that the body 125 is in the down position.

The insert changer 10 further includes a spacer block 265 which is disposed between the body 125 and the pneumatic lifter 300. The spacer block 265 constitutes a rectangular block having a round piston rod opening 269 formed centrally therethrough. The piston rod opening 269 has a diameter somewhat larger than the diameter of the piston rod 231 to allow frictionless movement of the piston rod 231 therethrough. The spacer block 265 is preferably integrally formed with the mounting piece 101, and is attached to the pneumatic lifter 300 by a screw 273 in one corner thereof.

FIGS. 2 and 3 illustrate the pneumatic lifter 300 for lifting and lowering the body 125 via the piston rod 231. The lifter 300 comprises a block-shaped housing 304 having four side walls 308 and an integral top cover 312. The top cover 312 has an upper piston hole 316 formed through the center thereof having a diameter equivalent to the diameter of the piston rod 231 so that the piston rod 231 may pass tightly therethrough. An annular groove 320 is recessed into the inner wall of the upper piston hole 316 for receiving an annular sealing quad-ring 324 therein in order to pressure-seal the top of the housing 304.

The lifter 300 further includes a square bottom plate 332 which is attached to the bottom of the housing 304 by corner screws (not shown). The bottom plate 332 has a lower piston hole 336 centrally formed therethrough and having a diameter equivalent to the piston rod 231 diameter so that the piston rod 231 may pass tightly therethrough. An annular groove 340 is recessed into the inner wall of the lower piston hole 336 for receiving an annular sealing quad-ring 342 therein in order to pressure-seal the bottom of the housing 304. An outer edge 344 of an upper surface 348 of the bottom plate 332 abuts against and mates with a bottom rim 352 of the housing side walls 308. The bottom rim 352 is provided with an annular groove 356 recessed therein for receiving an O-ring 360 therein. The O-ring provides a pressure seal at a seam 364 formed between the bottom rim 352 and the outer edge 344 of the upper surface 348.

The inside of the housing 304 defines a cylinder 372 which is comprised of an upper pressure chamber 374 and a lower pressure chamber 376 and which has an inner wall 380 and a ceiling 382. A generally plate-shaped piston 384 is disposed within the cylinder 372 and is tightly and rigidly mounted on the piston rod 231. The piston 384 separates the upper pressure chamber 374 from the lower pressure chamber 376 and functions to alternatively lift and lower the piston rod 231, and hence the body 125. An outer circumferential edge 388 of the piston 384 seals against the inner wall 380 of the cylinder 372, and an annular inner edge 390 of the piston 384 seals against the piston rod 231. The outer edge 388 of the piston 384 has an outwardly opening, annular groove 392 recessed therein for receiving an annular sealing quad-ring 396 therein in order to pressure-seal the upper pressure chamber 374 from the lower pressure chamber 376. The center of the piston 384 has a round piston opening therein through which passes the piston rod 231, the piston having a diameter equivalent to the diameter of the piston rod 231 in order to form a tight seal therebetween. The piston rod 231 has first, second and third annular grooves 400, 402 and 404 recessed at intervals into its outer surface around the circumference thereof. The first and third annular grooves 400 and 404 are formed to respectively receive an upper snap-ring 408 and a lower snap-ring 412 therein. The grooves 400 and 404 and their corresponding snap-rings 408 and 412 are spaced on the piston rod 231 so as to trap or confine the piston 384 therebetween on the piston rod 231 as can be seen in FIG. 3. The second annular groove 402 on the piston rod 231 is formed between the first groove 400 and the second groove 404. The second groove 402 is juxtaposed against a fourth annular groove 416 recessed into the inner edge 390 of the piston 384, wherein the second groove 402 and fourth groove 416 have juxtaposed open faces so that an enclosed annular chamber is formed by the two respective grooves 402 and 416. The enclosed chamber contains an O-ring 420 fitted tightly therein in order to provide a pressure seal at the juncture between the piston rod 231 and the piston 384.

Referring now to FIG. 2, one side of the pneumatic lifter 300 is provided with an upper pneumatic port 440 and a lower pneumatic port 444 formed thereon. The pneumatic ports 440 and 444 have respective inlets 448 and 452 for connecting to air hoses (not shown) which are connected to a source of pressurized air. The ports 440 and 444 communicate into the cylinder 372 and the upper port 440 opens or communicates into the upper pressure chamber 374 in the cylinder 372 while the lower port 444 communicates into the lower pressure chamber 376.

While the foregoing describes a preferred embodiment of an elevation means, other devices will adequately perform the same function. By way of example, the elevation means could comprise an electric motor or a hydraulic lifter.

II. Spindle Assembly

Referring now to FIG. 4, a spindle assembly 36 having a pressure foot 40 mounted on the bottom thereof is shown. The pressure foot 40 has a generally cylindrical shape and is supported by and secured onto the spindle assembly 36 by respective locking clamps 505 and 509 disposed on opposite sides thereof. The pressure foot 40 is mounted onto the spindle assembly 36 via the locking clamps 505 and 509 which mount onto shafts 511 and 513 and which are tightened thereon by screws 517 and 519. A transparent, curved door 523 having a knob 525 is formed on one side of the pressure foot 40 and is mounted on a spring hinge (not shown). A vacuum outlet tube 533 exits from one side of the pressure foot 40 and connects to a vacuum which vacuums out loose chips from the pressure foot 40 occasioned by drilling into the printed circuit boards 26.

A bottom 537 of the pressure foot 40 is configured to receive and securely hold a pressure foot insert 60 therein. To this end, the bottom 537 of the pressure foot 40 has a large, circular counter-bore 545 recessed therein for receiving the pressure foot insert 60. In accordance with one feature of the present invention, the pressure foot insert 60 is held within the circular counter-bore 545 by oppositely poled magnets on the pressure foot 40 and on the insert 60. In the preferred embodiment, as illustrated in FIG. 4, three small, round magnets 549 having a first polarity are formed or embedded into an upper surface 553 of the circular counter-bore 545. The three magnets 549 are disposed around the edge of the circular counter-bore 545 at 120 degree intervals. A round hole 557 is formed through the center of the upper surface 553 of the counter-bore 545. Further, a lateral opening 561 opens into the upper surface 553 and communicates with the vacuum outlet tube 533. A pair of adjacent small round passages 565 and 567 are formed through the side of the pressure foot 40 and open into the side of the circular counter-bore 545. The passages 565 and 567 provide access for lasers of a broken bit detector (not shown) mounted onto a mounting arm 569 formed onto one side of the pressure foot 40. A small alignment pin 571 is formed onto and projects downward from the bottom 537 of the pressure foot 40 near its periphery.

Referring now also to FIG. 5, a preferred embodiment of the pressure foot insert 60 is illustrated. The pressure foot insert 60 includes a plate-like disc 602 having a flat bottom side 604, as can be seen in FIG. 4, and a concave top side 608, as can be seen in FIG. 5. The bottom side 604 of disc 602 is flat except for a drill tool hole 612 formed centrally therein and a contact element 616 formed around the edge of the drill tool hole 612. The contact element 616 is formed by a short annular wall 620 projecting downward from the edge of the drill tool hole 612 and having a bottom contact face 624 having angled slots 628 therein to allow ingress of air during the vacuuming of loose chips during the drilling operation. The bottom side 604 of the disc 602 has a small, round alignment hole or foramen 630 recessed therein which is shaped to receive the rounded boss 186 on the insert-changer body 125 when the engaging portion 127 of the body 125 holds the pressure foot insert 60 thereon. Further, the periphery of the disc 602 is provided with a curved slot 632 formed therein which is positioned to receive the alignment pin 571 on the bottom 537 of the pressure foot 40 when the insert 60 is contained within the circular counter-bore 545.

Referring now to FIG. 5, the top side 608 of the disc 602 has formed coaxially thereon an inner, circular raised portion 640 which projects upward therefrom. A outer side wall 644 of the raised portion 640 has a groove 646 formed therein which extends around the circumference of the side wall 644. The top of the raised portion 640 has three small round magnets 648 formed or embedded therein and having a second polarity. The three magnets 648 are disposed around the periphery of the top of the raised portion 640 at 120 degree intervals and can be juxtaposed against the corresponding oppositely poled magnets 549 in the pressure foot 40 when the pressure foot insert 60 is oriented so that the alignment pin 571 sits within the curved slot 632 on the periphery of the disc 602. The drill tool hole 612 opens through the center of the raised portion 640. An inner wall 652 of the drill tool hole 612 has a pair of adjacent, small round passages 656 and 660 opening therein which extend laterally through the raised portion 640 and which exit onto the outer side wall 644 thereof. The round passages 656 and 660 are disposed to mate with the round passages 565 and 567 in the side of the pressure foot 40 to allow access of the broken bit lasers to the drill tool 44.

Referring now to FIG. 6, a drill tool 44 is shown. The drill tool 44 includes a shank 672, a ring-shaped collar 676 having an outer surface 678, and a drill tip 682 having flutes 686 therein. The shank 672 of the drill tool 44 is firmly held in a collet 690 in the spindle 38.

Referring now to FIG. 1 and to FIG. 7, a pressure foot insert magazine 56 is shown. The insert magazine 56 comprises an L-shaped member having a vertical, wall-like mounting portion 701 which mounts onto the side of the drill tool magazine 48 using screws 705, and a rectangular, horizontal holding plate 709 for holding a plurality of pressure foot inserts 60 thereon. In FIG. 7, a bottom surface 713 of the holding plate 709 is shown having recessed therein a plurality of circular bays 717 each shaped to receive a pressure foot insert 60 therein and having a holding means for releasably holding the insert 60 therein. A first position 718 and third position 720 contain respective pressure foot inserts 60 therein, while a second position 719 is empty. The circular bays 717 are configured similarly to the circular counter-bore 545 in the pressure foot 40. In the preferred embodiment, each bay 717 has a set of three magnets 721 embedded into the upper surface thereof and having a first polarity. The magnets 721 are disposed in 120 degree intervals so as to be juxtaposed against the magnets 649 on a pressure foot insert 60 when the insert 60 is held within the bay 717. Further, an alignment pin 725 is formed adjacent each bay 717 to mate with the curved slot 632 on each insert 60.

Preferably, unless otherwise indicated, the various components constituting the insert changer 10 and the pressure foot 40 are made from aluminum for lightness and strength. The piston 384 and piston rod 231, however, are preferably made from steel to provide additional strength.

III. Operation of Insert Changer

In the typical operation of an automatic printed circuit board drilling machine, a stack of printed circuit boards 26 is placed within the rectangular recessed portion 22 of the worktable 14. A computer controller directs the various machine operations. The controller moves the worktable 14 beneath the spindle assembly 36 in a horizontal X-Y plane and correctly positions the printed circuit boards 26 below the drill tool 44 for drilling holes in predefined locations on the boards 26. At some point during the drilling operation, either it will become necessary to drill a hole in the circuit boards 26 having a different diameter, or the drill tool 44 currently being used will become worn to the point of needing replacement. In order to change the drill tool 44, the pressure foot insert 60 held within the pressure foot 40 must first be removed by the insert changer 10. As discussed previously, it is necessary to first remove the insert 60 to allow the transfer collet 30 on the drill tool transfer assembly 28 to access the collar 676 on the drill tool 44.

In removing the pressure foot insert 60 from the pressure foot 40, the worktable 14 moves the insert changer 10 directly underneath the pressure foot 40. The body 125 on the insert changer 10 is normally in the down position so that the changer 10 will not interfere or collide with other parts of the drilling machine (e.g. the insert magazine 56 or the pressure foot 40) during operation of the drilling machine. Movement means on the spindle assembly 36, commonly a motor mounted directly on the spindle assembly 36, lowers the pressure foot 40 and the spindle 38 holding the drill tool 44. At the same time, the elevation means, for example the pneumatic lifter 300 described herein, elevates the gripper, for example the body 125 described herein, to transfer the pressure foot insert 60 from the pressure foot 40 to the gripper. The pressure foot 40 is lowered to the extent necessary to bring the bottom side 604 of the insert 60 into contact with the upper surface 165 of the body 125 when the body 125 is in the up position.

The pneumatic lifter 300 disclosed herein employs the dual pressure chamber configuration described previously to alternatively lift and lower the body 125. To lift the body 125, pressurized air is forced into the lower pressure chamber 376 through the lower pneumatic port 444. The port 444 is connected to any standard source of pressurized air. The lower pressure chamber 376 is pressure-sealed by the respective sealing rings 342, 360, 396 and 420 disposed within the cylinder 372 and, therefore, the increased pressure in the lower pressure chamber 376 forces the piston 384 upward. The piston rod 231 attached to the piston 384 by the respective snap-rings 400 is thus forced upward which thereby moves the body 125 upward. In the preferred embodiment, the body 125 may be elevated about 0.75 inches from its lowest or down position to an up position.

To lower the body 125, the pressurized air in the lower pressure chamber 376 is released while pressurized air is forced into the upper pressure chamber 374 through the upper pneumatic port 44. The upper pressure chamber 374 is pressure-sealed by the respective sealing rings 324, 396 and 420. The piston 384 and thus the piston rod 231 and body 125 are thereby lowered.

The lifting and lowering of the body 125 and of the pressure foot 40 and spindle 38 is controlled by the drilling machine controller. Movement measuring means are provided on the spindle assembly 36 which means are well known to one skilled in the art. Movement of the body 125 on the insert changer 10 is also controlled by the drilling machine controller. Upward movement of the body 125 is limited by abutment of the upper snap-ring 408 against the ceiling 382 of the cylinder 374. Downward movement of the body 125 is limited by abutment of the bottom of the body 125 against the spacer block 265. This event is detected by the sensor 456 mounted on one side of the pneumatic lifter 300 below the depressor block 251. When the body 125 reaches the down position, as depicted in FIG. 3, the depressor block 251 depresses the arm 464 which in turn depresses the switch 468. The switch-magnet position sensor 456 then signals the controller via the cable 472 that the body 125 is the down position.

An important novel feature of the present invention is the means by which pressure foot insert 60 is retained within the pressure foot 40, and the means by which the body 125 grips and removes the pressure foot insert 60 from the pressure foot 40. It will be noted that the three magnets 549 embedded within the counter-bore 545 and having a first polarity provide an attracting magnetic force to the three magnets 648 in the pressure foot insert 60 which have a second polarity. When the insert 60 is mounted into the counter-bore 545 so that the alignment pin 571 is disposed within the slot 632 on the insert 60, the respective oppositely poled magnets 549 on the pressure foot 40 will be juxtaposed against the respective magnets 648 on the insert 60. The resulting magnetic bond between the insert 60 and the pressure foot 40 is sufficiently strong to securely retain the insert 60 in the pressure foot 40.

In the preferred embodiment of the present invention as described herein, a vacuum means is provided on the insert changer 10 for gripping the insert 60 and removing it from the counter-bore 545. To this end, a vacuum source is connected to the nozzle 141 of the vacuum hose fitting 139 by, for example, a standard rubber hose which fits around the nozzle 141 and which is held thereon by the ribs 145. Once the body 125 is raised to the up position and the pressure foot 40 has been lowered by the controller so that the upper surface 165 of the body 125 contacts the insert 60 as described previously, the vacuum source is turned on. When this occurs, a low-pressure area is created through the vacuum hole 161 in the body 125 and in the annular vacuum seal region 211 defined horizontally between the outer sealing ring 173 and the inner sealing ring 181. When the engaging portion 127 of the body 125 contacts the insert 60, the flat, bottom side 604 of the insert disc 602 covers the sealing rings 173 and 181 thereby closing the vacuum seal region 211. The vacuum seal region 211 is further defined below by the inner shelf 183 on the upper surface 165. The respective curved flanges 201 and 203 of the sealing rings 173 and 181 conform against the insert disc 602 and form a seal therebetween. In an alternative preferred embodiment, the flange 203 on the inner sealing ring 181 may instead be formed to extend inward toward the center of the body 125. In this configuration, the bottom lip 195 may also be formed to project inward to fit in a correspondingly shaped annular recess. Although this configuration may provide an effective seal between the inner sealing ring 181 and the insert 60, practical implementation may be difficult due to a lack of commercial availability of an appropriate sealing ring.

To disengage the insert 60 from the pressure foot 40, the vacuum connected to the body 125 is turned on and the controller then raises the pressure foot 40 and simultaneously lowers the body 125. The low-pressure area within the vacuum seal region 211 creates a gripping force between the insert 60 and the body 125 which is sufficiently strong to overcome the magnetic bonding force between the respective oppositely poled sets of magnets 549 and 648 to disengage the insert 60 from the pressure foot 40 upon downward movement of the insert changer body 125. Thus, When the body 125 and pressure foot 40 are separated, the body 125 pulls the insert 60 out of the pressure foot 40. When the insert 60 is disposed on and held by the body 125, the rounded boss 186 on the inner shelf 183 of the upper surface 165 is engaged into the foramen 630 recessed into the bottom side 604 of the disc 602. This arrangement keeps the insert 60 in place and properly aligned upon the body 125 at all times.

Another advantageous feature of the present invention is the design of the sealing rings 173 and 181 on the body 125 and the manner in which the rings 173 and 181 are attached onto the upper surface 165 of the body 125. Referring to FIG. 3a, it can be seen that the outer recess 169 and inner recess 177 formed into the upper surface 165 of the body 125 are shaped to receive the respective sealing rings 173 and 181. Specifically, the ledges 205 and 207 are provided to project inward into the respective recesses 169 and 177 so that when the rings 173 and 181 are fit into the respective recesses 169 and 177, the bottom lips 193 and 195 on the respective rings 173 and 181 project underneath the respective ledges 205 and 207 so that the outer rims 197 and 199 on the respective lips 193 and 195 fit snugly and tightly underneath the ledges 205 and 207. This configuration advantageously functions to retain the rings 173 and 181 within the respective recesses 169 and 177 so that the rings 173 and 181 are not displaced from the recesses 169 and 177 by forces applied thereto during gripping and releasing of the pressure foot insert.

Figure 8:
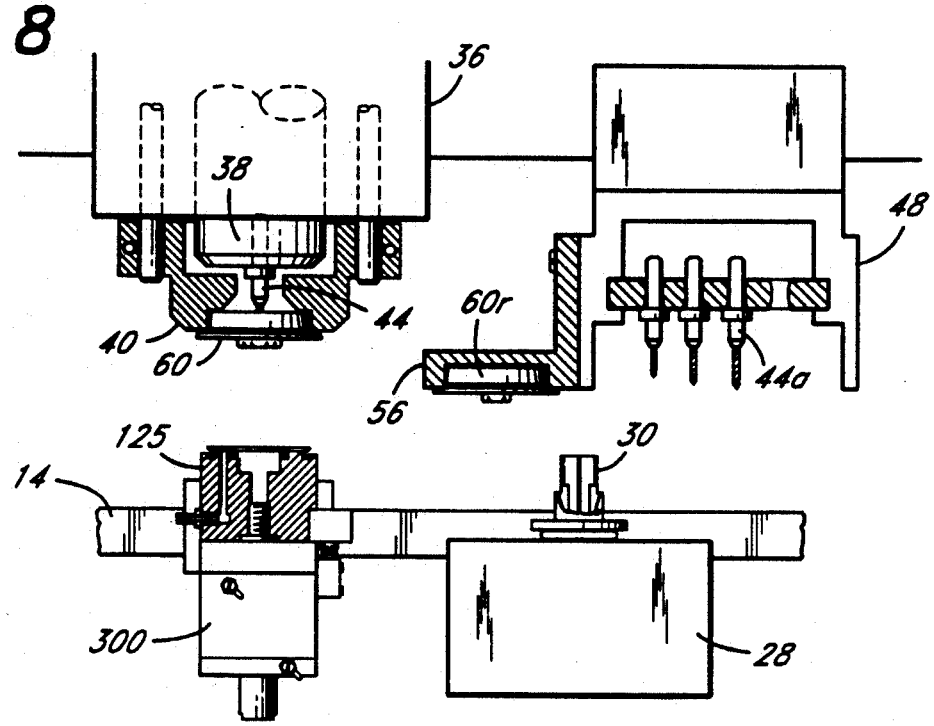
FIG. 8 is a side view showing a step of positioning a pressure foot insert changer below a pressure foot.
Figure 9:
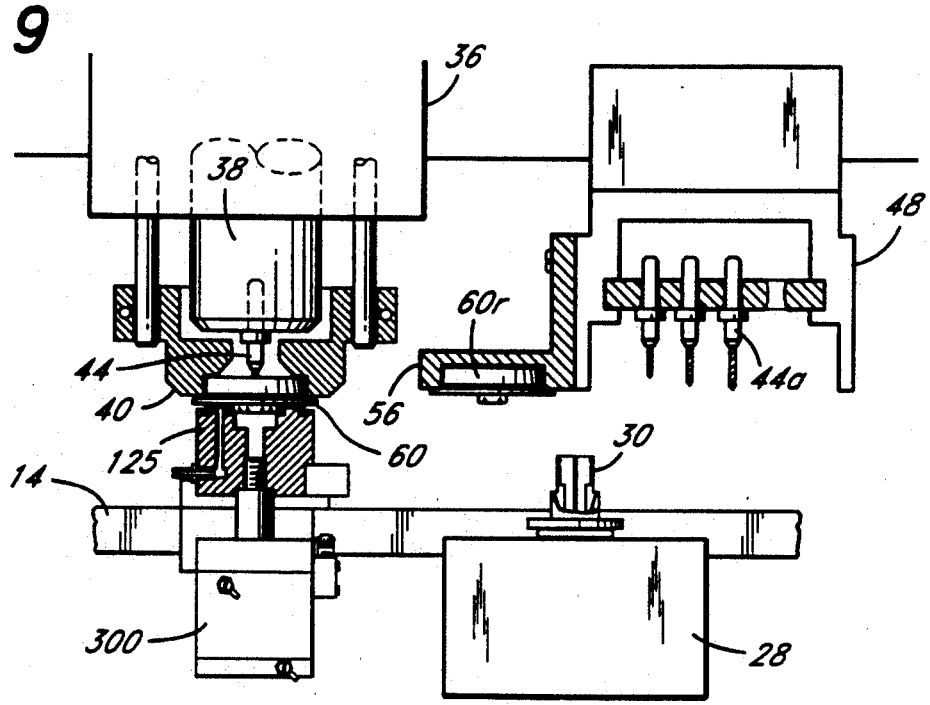
FIG. 9 is a side view showing a step of gripping a pressure foot insert with the insert changer.
Figure 10:
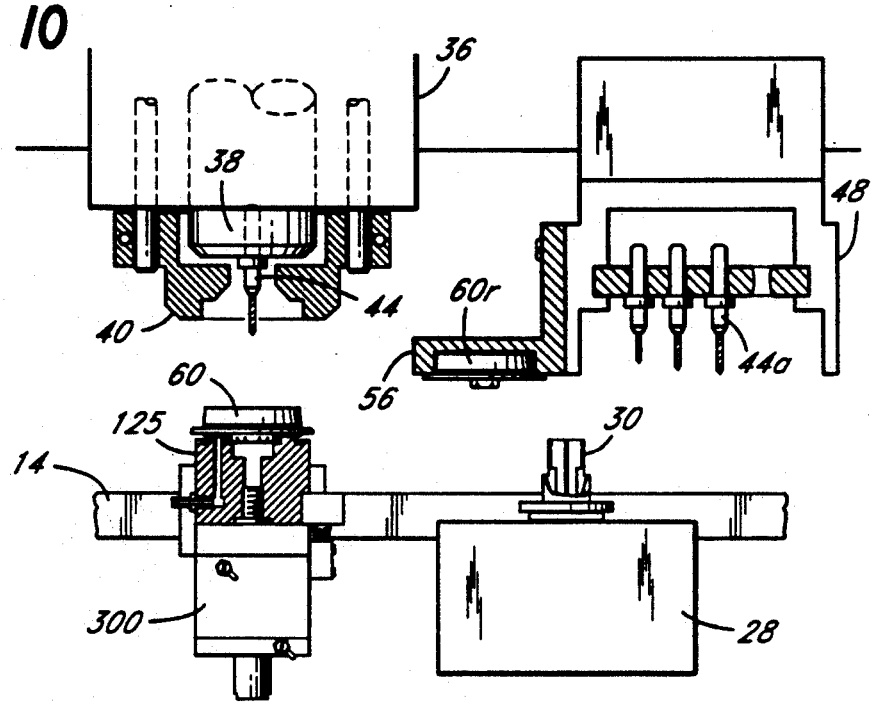
FIG. 10 is a side view showing a step of moving the changer to a down position with the gripped insert.
Figure 11:
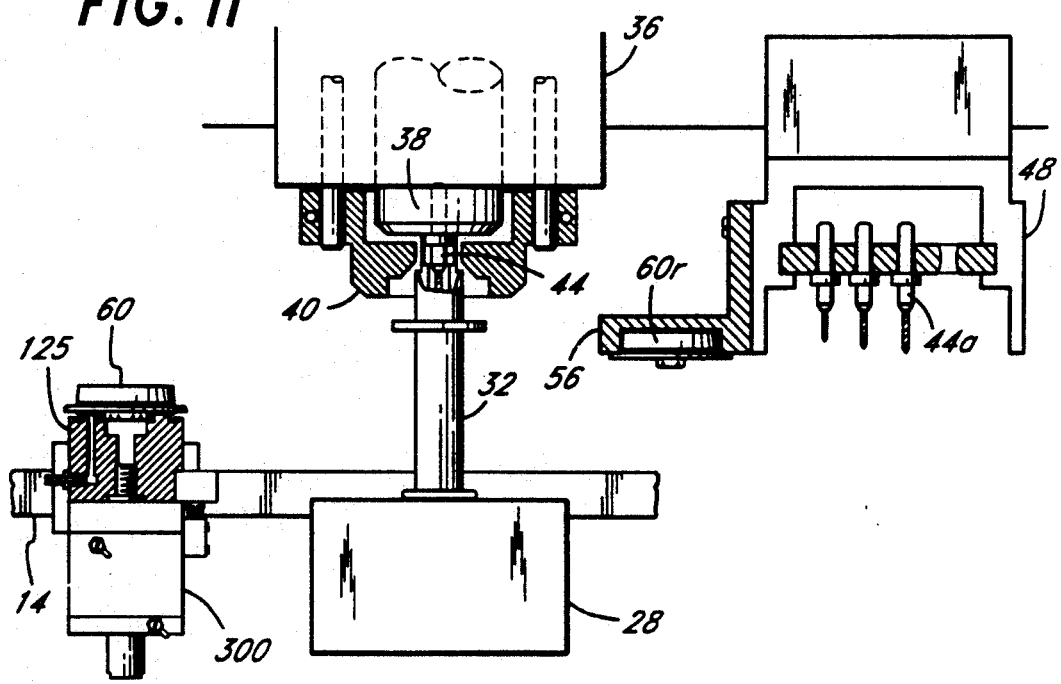
FIG. 11 is a side view showing a step of grabbing a drill tool from a drill spindle using a drill tool transfer assembly.
Figure 12:
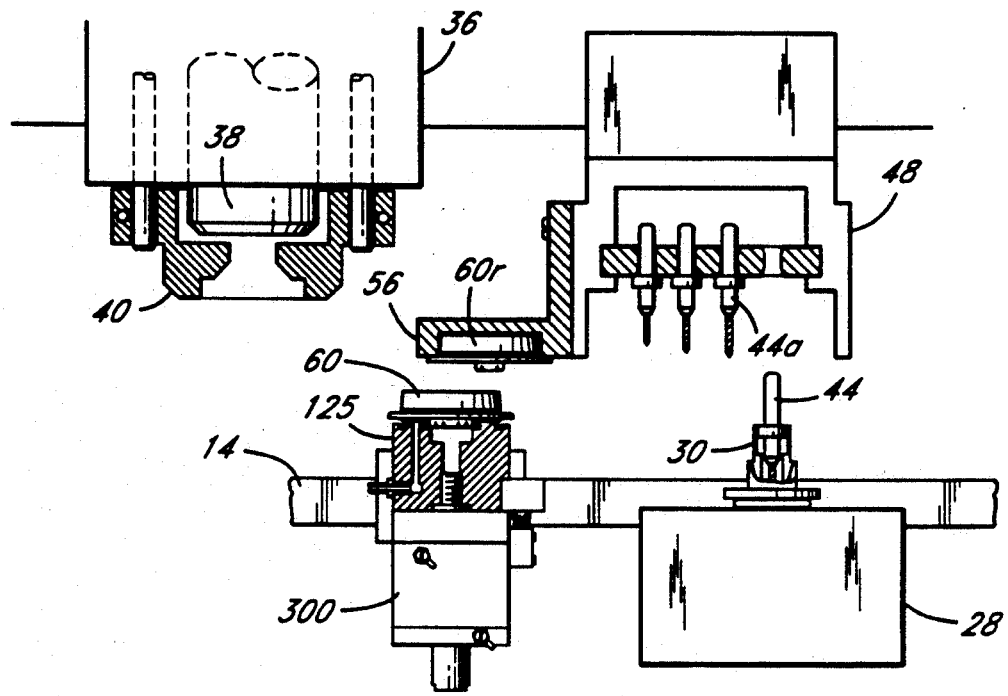
FIG. 12 is a side view showing a step of moving the transfer assembly and grabbed drill tool below a drill tool insert magazine.
Figure 13:
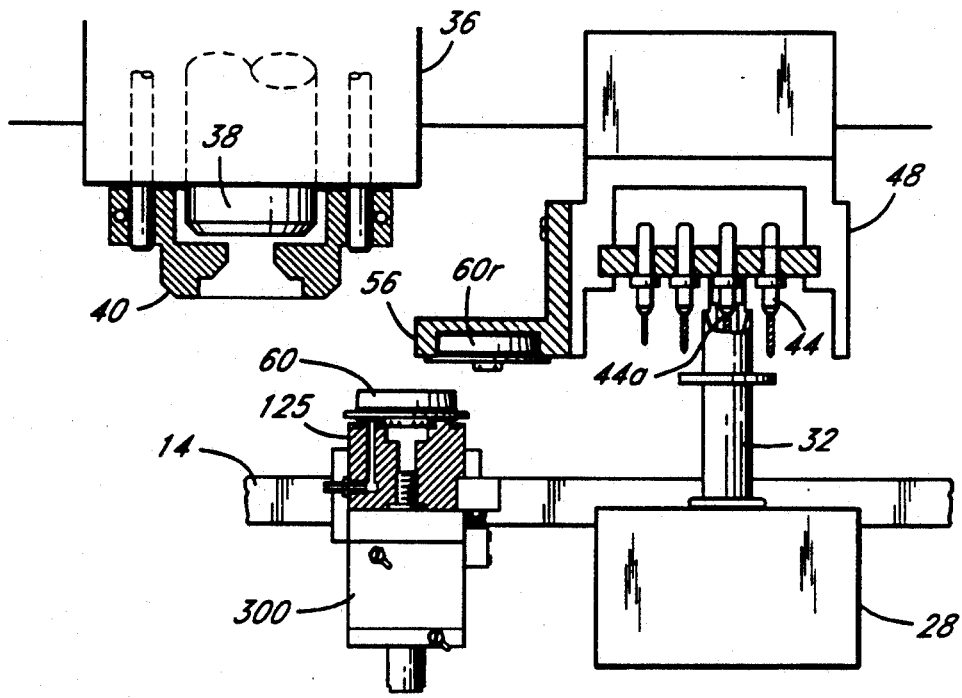
FIG. 13 is a side view showing a step of grabbing a new drill tool from the drill tool magazine.
Figure 14:
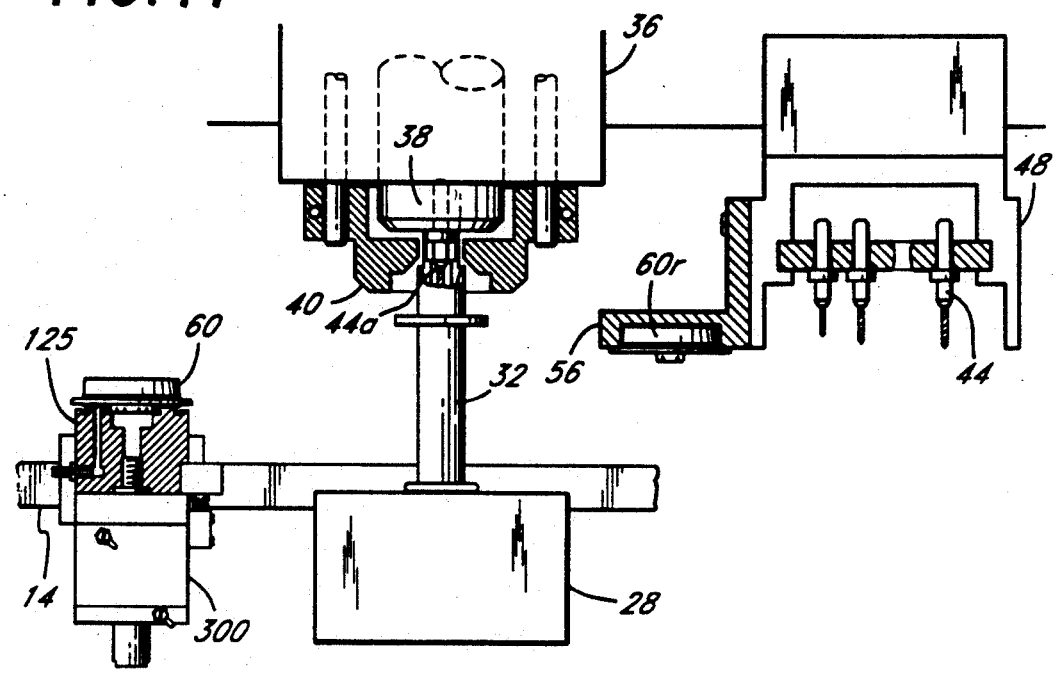
FIG. 14 is a side view showing a step of inserting the new drill tool into the drill spindle.
Figure 15:
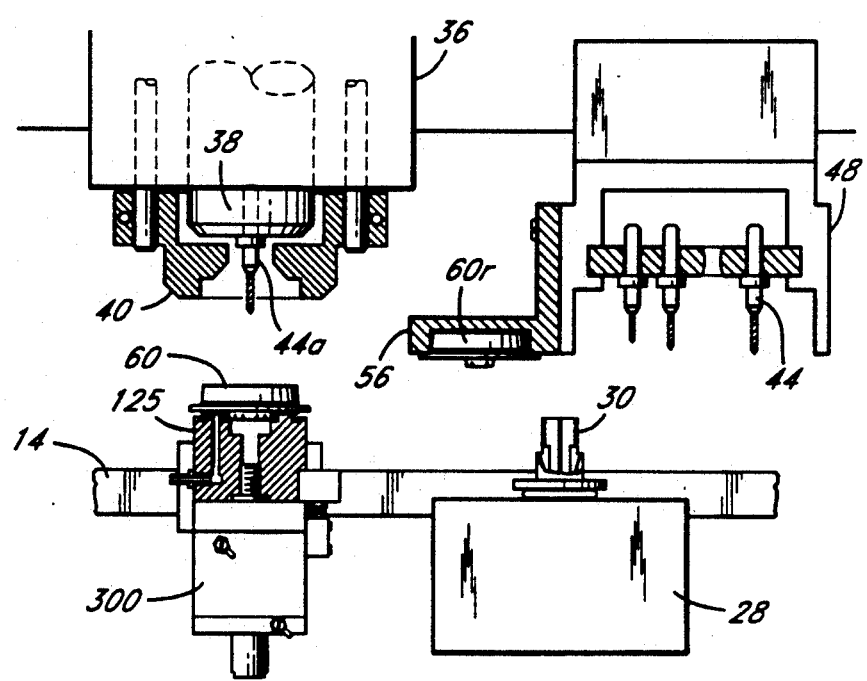
FIG. 15 is a side view showing a step of moving the insert changer below the pressure foot.
Figure 16:
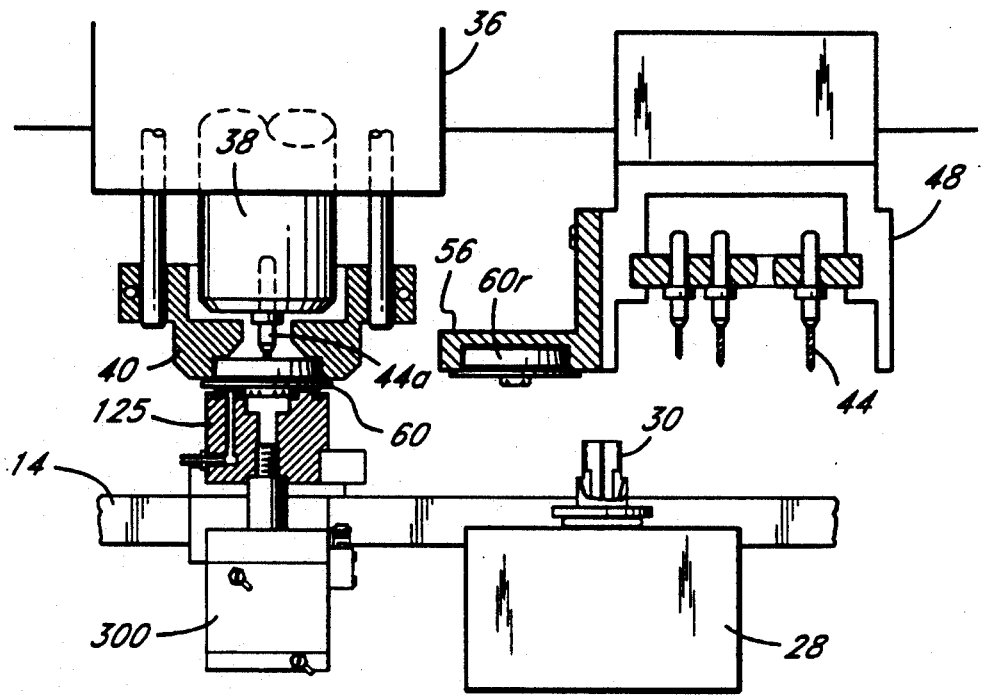
FIG. 16 is a side view showing a step of reinserting the pressure foot insert into the pressure foot.
Figure 17:
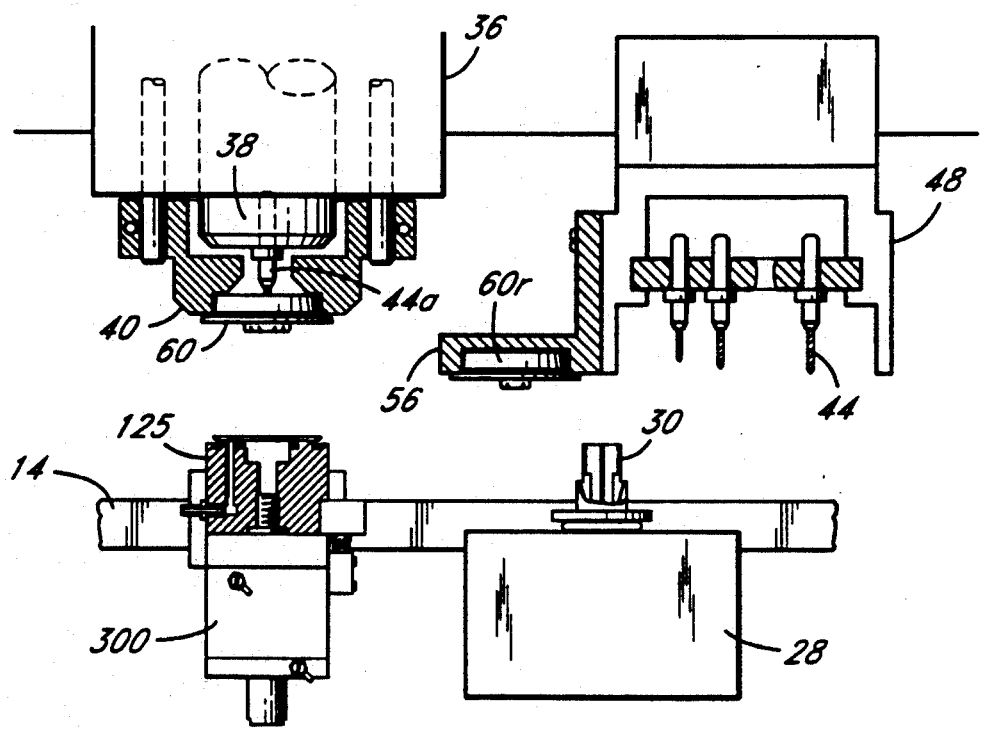
FIG. 17 is a side view showing a step of retracting the insert changer away from the pressure foot after a drill tool change has been completed.

Referring now to FIGS. 8-17, a series of steps are illustrated showing the method by which a pressure foot insert 60 is removed from the pressure foot 40 while the drill tool 44 is replaced and also then showing the insert 60 being replaced. FIG. 8 shows the insert changer 10 positioned directly beneath the spindle 38 and pressure foot 40 prior to removal of the pressure foot insert 60 from the circular counter-bore 545. Also shown are the drill tool transfer assembly 28, the drill tool magazine 48, and the pressure foot insert magazine 56. It will be assumed here that the drill tool 44 in the spindle 38 is worn and it is desired to replace the worn drill tool 44 with a new drill tool 44a of the same size stored in the drill tool magazine 48. In FIG. 9, the spindle 38 and pressure foot 40 have been lowered and the body 125 on the changer 10 has been raised to its up position, thereby positioning the insert 60 in contact with the upper surface 165 of the body 125. In FIG. 10, the spindle 38 and pressure foot 40 are moved upward while the body 125, which has now gripped the pressure foot insert 60, has been retracted to its down position. In FIG. 11, the transfer assembly 28 has been positioned directly below the spindle assembly 36, and the transfer piston 32 has been elevated so that the drill tool transfer collet 30 is moved upward through the now-vacated circular counter-bore 545 so that the collet 30 may access and grip the collar 676 on the drill tool 44. In FIG. 12, the transfer piston 32 has retracted downward and the worktable 14 has moved to position the transfer assembly 28 directly below a vacant drill tool slot in the drill tool magazine 48. In FIG. 13, the transfer piston 32 has been elevated so that the shank 672 of the worn drill tool 44 has been pressed into the vacant slot in the magazine 48, and the transfer assembly 28 has then been repositioned below a new drill tool 44a in a second slot of the magazine 48 and moved upward so that the transfer collet 30 engages the collar 676 of the new drill tool 44a. In FIG. 14, the transfer assembly 28 has been repositioned beneath the spindle assembly 36 and the transfer piston 32 has been moved upward so that the new drill tool 44 is mounted into the empty collet 690 on the spindle 38. In FIG. 15, the transfer collet 30 has been retracted and the insert changer 10 together with the gripped pressure foot insert 60 has been repositioned beneath the pressure foot 40. In FIG. 16, the spindle 38 and pressure foot 40 have again been lowered while the body 125 has been raised to the up position. At this point, the vacuum in the body 125 has been turned off so that when the gripped insert 60 is moved upward by the changer 10 in close proximity to the pressure foot 40, the magnets 549 in the pressure foot 40 attract the magnets 648 on the insert 60 thereby causing the pressure foot 40 to regain hold of insert 60 so that the insert 60 is again held within the pressure foot circular counter-bore 545. In FIG. 17, the spindle 38 and pressure foot 40 have been moved upward and the body 125 has been retracted while the pressure foot insert 60 is retained within the pressure foot 40.

In accordance with yet an additional feature of the present invention, a magazine is provided for storing a plurality of pressure foot inserts 60 preferably having different drill tool hole 612 diameters. During drilling, it is desirable to change a pressure foot insert 60 in response to a change in drill tool size. For example, an insert 60 having a drill tool hole 612 diameter of 0.140 inches is typically used for drill tools 44 having diameters of up to 0.125 inches, while an insert having a hole 612 diameter of 0.265 inches is used for drill tool diameters above 0.125 inches and up to 0.250 inches.

As seen in FIG. 7, the pressure foot insert magazine 56 has a plurality of bays 717 recessed into the bottom surface 713 thereof for each receiving and holding a pressure foot insert 60 therein. The inserts 60 are initially inserted manually into the insert magazine 56 and proper alignment of the inserts 60 in the respective bays 717 is achieved by aligning the respective alignment pins 725 in the curved slots 632 on the inserts 60 as shown in the first and third insert positions 718 and 720.

Figure 18:
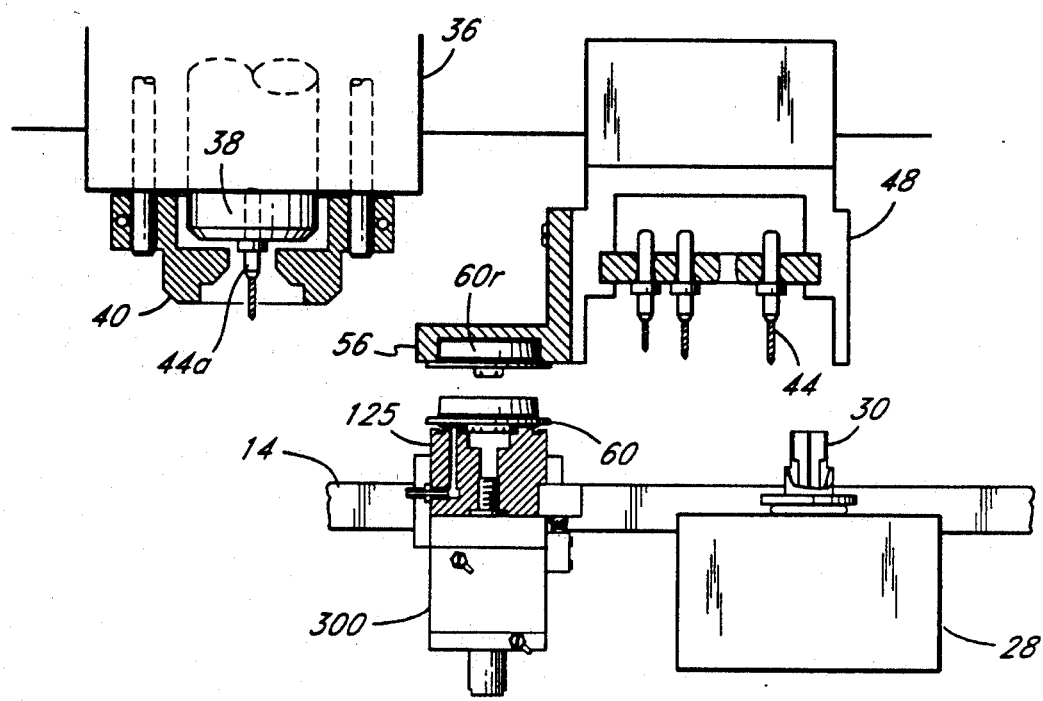
FIG. 18 is a side view showing a step of moving the insert changer with a pressure foot insert below a pressure foot insert magazine.
Figure 19:
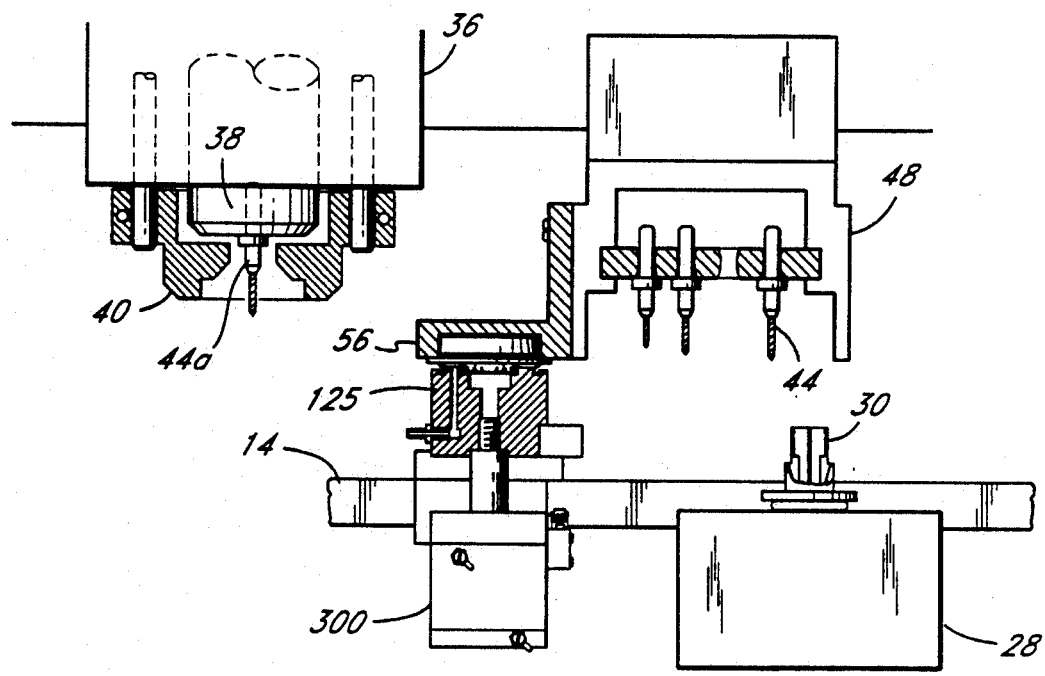
FIG. 19 is a side view showing a step of placing the pressure foot insert into the insert magazine.
Figure 20:
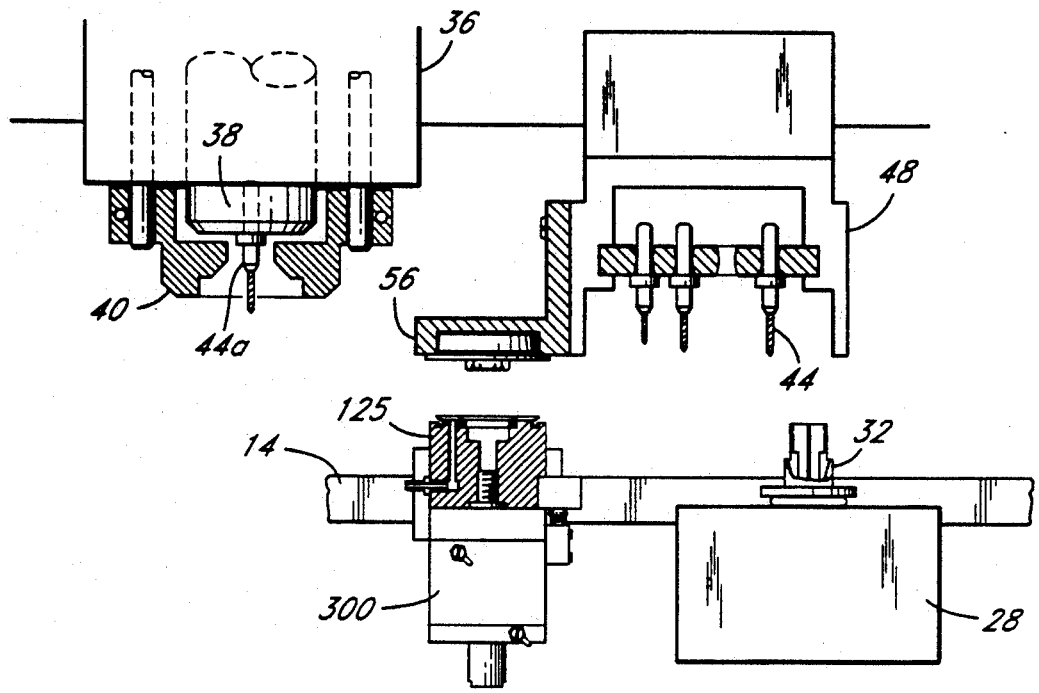
FIG. 20 is a side view showing a step of retracting the insert changer away from the insert magazine.
Figure 21:
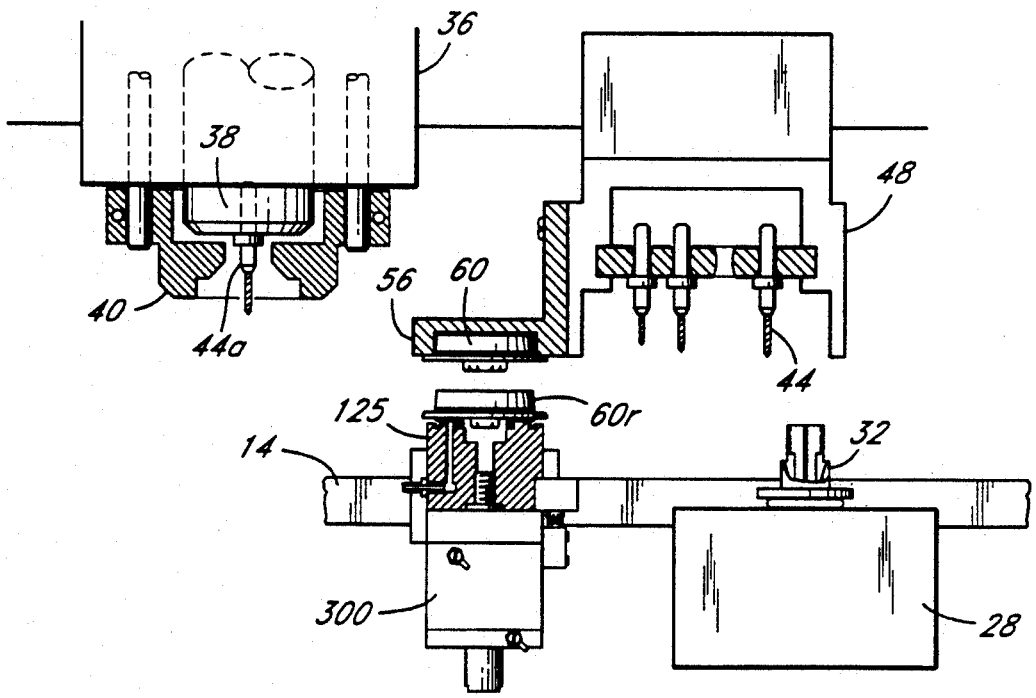
FIG. 21 is a side view showing a step of gripping a replacement insert from the insert magazine.

The present invention also includes a novel method for automatically changing a pressure foot insert 60 in a spindle assembly 36 during a drilling process. FIGS. 8-10, described previously, illustrate the steps of removing the pressure foot insert 60 from the pressure foot 40 using the insert changer 10. After the step illustrated in FIG. 10, which shows the insert 60 removed from the pressure foot 40, FIG. 18 illustrates a step of moving the insert changer 10 to position the changer 10 below the insert magazine 56. The X-Y axis movement capability of the worktable 14 is used to move the changer 10 directly below an empty bay in the magazine, such as the empty second position 719 shown in FIG. 7. In FIG. 19, the body 125 on the changer 10 has been lifted to its up position so that the insert 60 on the changer 10 is disposed within the bay 717 and held therein via the respective sets of attracting magnets 648 and 721. In FIG. 20, the body 125 has been lowered to the down position and has been moved directly below a replacement insert 60r stored in the insert magazine 56 wherein the replacement insert 60r has a drill tool hole 612 having a smaller diameter. In FIG. 21, the body 125 has moved up to grip the replacement insert 60r via the vacuum gripping means, and has then moved back to the down position holding the replacement insert 60r. Subsequently, the replacement insert 60r is moved below the pressure foot 40 and is placed therein by the insert changer 10, as shown in FIGS. 15-17 and as previously discussed. It will be noted that, in the normal course of a drilling operation, a pressure foot insert 60 change is initiated because of a change in the drill tool 44 diameter, and that therefore a drill tool 44 change (see steps illustrated by FIGS. 11-14 previously described) usually occurs prior to placement of the replacement insert 60r in the pressure foot 40 (FIGS. 15-17). Automatic changing of a pressure foot insert 60 in response to a change in drill tool 44 diameter permits keeping the diameter of the drill tool hole 612 in the insert 60 in close relation to the diameter of the drill tool 44 so that the contact element 616 on the insert 60 is kept in close proximity to the drill site during drilling, thereby reducing burrs and improving hole accuracy. Because the disclosed system is automatic, substantial time is saved in a drilling process requiring drilling holes of different diameters.

Having described the invention in connection with certain specific embodiments thereof, it is to be understood that further modifications may now suggest themselves to those skilled in the art, and it is intended to include such modifications as fall within the scope of the appended claims. For example, the gripper on the insert changer 10 may comprise a mechanical or other means for gripping the insert. Similarly, the means for holding the insert within the pressure foot may be mechanical, vacuum, electromagnetic, or any appropriate means for releasably holding the insert that falls within the scope of the claims. Finally, it will be noted that the present invention may also have other advantageous applications distinct from circuit board drilling machines such as use on routing machines or on other devices requiring removal and replacement of a removable insert.

I claim:

1. A drilling machine for rapidly and efficiently drilling holes in one or more printed circuit boards mounted thereon, comprising:
   a drilling machine controller for electronically controlling a printed circuit board drilling operation;
   a worktable mounted on said drilling machine and having said printed circuit boards mounted thereon, said worktable further being movable in a horizontal plane so that said circuit boards may be accurately and precisely moved in proper position so that said holes may be accurately drilled in said boards in predefined locations;
   a spindle assembly mounted on said drilling machine above said worktable and above said printed circuit boards, said spindle assembly comprising:
      a spindle having a drill tool mounted in the bottom thereof for drilling a hole in a circuit board;
      means for moving said spindle in a vertical Z-axis and controlled by said controller so that said spindle may be moved downward toward said printed circuit boards during a drilling stroke to drill a hole therein using said drill tool; and
      a pressure foot for pressing down upon said circuit boards to hold said boards securely down to prevent movement thereof and to prevent burrs arising around said holes during said drilling stroke;
   a drill tool transfer device mounted on said drilling machine adapted to pass through said pressure foot and grip said drill tool in said spindle and to remove said drill tool from said spindle and for placing a second drill tool in said spindle;
   a removable pressure foot insert releasably retained in said pressure foot and having a drill hole through which said drill tool passes during said drill stroke wherein said drill hole is too small to permit passage of said drill tool transfer device therethrough, said insert being removable to allow said drill tool transfer device to enter through the pressure foot to allow access of the member to said drill tool so that said drill tool may be removed from said spindle;
   means for releasably retaining said insert in said pressure foot so that said insert may be quickly and automatically removed therefrom and subsequently replaced therein thereby saving substantial time in a drilling operation;
   an insert changer mounted on said machine for automatically removing and replacing said pressure foot insert from said pressure foot;

movement means for alternately bringing said changer and said insert into contact and moving said changer and said insert apart; and means on said insert changer for releasably retaining said pressure foot insert on said insert changer when said changer is brought into contact with said insert so that when said insert changer and said pressure foot are moved apart, said insert is retained on said changer so that a drill tool change may be effected in said spindle.

2. The drilling machine as defined in claim 1, wherein said means for releasably retaining said insert on said changer comprises a vacuum means for gripping said insert.

3. In a drilling machine having a movable worktable for supporting a workpiece thereon and having a spindle assembly movable in a vertical axis, wherein said spindle assembly includes a pressure foot having a removable pressure foot insert mounted therein and a spindle having a drill tool mounted therein for drilling into the workpiece, a method for automatically removing said pressure foot insert from said pressure foot, comprising the steps of:

providing a device having a vacuum means for gripping said insert;

moving said device toward said pressure foot so that a vacuum seal region is formed between said device and said insert when said device comes into contact with said insert;

activating said vacuum means so that said device grips said insert by said vacuum means; and moving said device away from said pressure foot so that said device disengages said gripped insert from said pressure foot.

4. The drilling machine as defined in claim 1, wherein said machine further comprises a pressure foot insert magazine for releasably storing one or more pressure foot inserts thereon so that said insert changer may selectively place an insert in said magazine or remove an insert from said magazine.

5. A drilling machine, comprising:

a worktable for supporting a workpiece thereon;

a spindle assembly movable in a vertical axis, said spindle assembly comprising:

a spindle having a drill tool mounted therein for drilling into said workpiece; and a pressure foot having a removable pressure foot insert releasably retained therein; and an insert changer for automatically removing said pressure foot insert from said pressure foot, said insert changer comprising a gripper for pulling said insert from said pressure foot, wherein said gripper includes a vacuum means for gripping said insert.

6. The machine as defined in claim 5, wherein said gripper comprises an engaging portion which contacts said insert and which cooperates with said insert to create a vacuum seal region wherein said region is connected to a vacuum source for lowering the pressure in said region thereby creating a gripping force between said gripper and said insert.

7. The machine as defined in claim 6, wherein said engaging portion comprises an upper surface, said upper surface having formed thereon an outer sealing ring and an inner sealing ring disposed within said outer ring, said rings being disposed so that when said gripper contacts against said insert, said outer and inner rings contact said insert so that said vacuum seal region is defined between said rings and on one side by said insert.

8. The machine as defined in claim 7, wherein said upper surface comprises:

an outer annular recess shaped to receive said outer sealing ring, said outer recess having a first ledge projecting into said outer recess so that a first lip on said outer ring fits under said first ledge when said outer ring is placed into said outer recess so that said outer ring is retained within said outer recess; and an inner annular recess shaped to receive said inner sealing ring, said inner recess having a second ledge projecting into said inner recess so that a second lip on said inner ring fits under said second ledge when said inner ring is placed into said inner recess so that said inner ring is retained within said inner recess.

9. In a drilling machine having a movable worktable for supporting a workpiece thereon and having a spindle assembly movable in a vertical axis, wherein said spindle assembly includes a pressure foot and a spindle having a first drill tool mounted therein for drilling into the workpiece, a method for drilling a workpiece, comprising the steps of:

providing a first removable pressure foot insert retained on said pressure foot, said insert having a first contact element for pressing against a circuit board during a drilling operation, said contact element defining a first drill hole therethrough wherein said first drill hole has a first diameter;

automatically removing said first insert from said pressure foot;

replacing said first drill tool with a second drill tool having a different diameter from said diameter of said first drill tool;

selecting a second removable pressure foot insert having a second contact element defining a second drill hole therethrough wherein said second drill hole has a second diameter different from said first diameter of said first drill hole such that said second contact element more closely corresponds to said second drill tool than said first contact element; and automatically mounting said second insert on said pressure foot.

10. The method as defined in claim 9, further comprising the steps of:

providing a pressure foot insert magazine on said drilling machine, said magazine being capable of releasably holding a plurality of said inserts;

storing said second insert on said magazine;

automatically placing said first insert in an empty position on said magazine; and automatically removing said second insert from said magazine.

11. The machine as defined in claim 5, wherein said machine further comprises:

a tool transfer assembly for automatically removing said drill tool from said spindle; and a drill tool magazine for storing a plurality of drill tools wherein said drill tools are mounted in said magazine such that said tool transfer assembly may automatically insert a drill tool therein and automatically remove a drill tool therefrom.

12. The machine as defined in claim 5, wherein said machine further comprises an insert magazine for storing a plurality of inserts thereon so that said insert changer may automatically change said insert in said pressure foot by placing said insert in said magazine and then taking a second insert from said magazine and placing said second insert in said pressure foot.

13. The machine as defined in claim 12, said insert magazine comprising a holding plate having at least one bay recessed into a bottom surface thereof wherein said bay is configured to receive a pressure foot insert therein and is provided with a holding means for releasably holding said insert securely therewithin.

14. The method as defined in claim 9, wherein said second diameter is smaller than said first diameter.

* * * * *